(12) United States Patent
Gaboury

(10) Patent No.: US 6,760,205 B1
(45) Date of Patent: Jul. 6, 2004

(54) ACTIVE INDUCTANCE FOR ESD PARASITIC CANCELLATION

(75) Inventor: Michael J. Gaboury, Burnsville, MN (US)

(73) Assignee: Xilinx, Inc., San Jose, CA (US)

( * ) Notice: Subject to any disclaimer, the term of this patent is extended or adjusted under 35 U.S.C. 154(b) by 76 days.

(21) Appl. No.: 10/116,188

(22) Filed: Apr. 3, 2002

(51) Int. Cl.[7] .............................................. H02H 9/00
(52) U.S. Cl. ........................................................ 361/56
(58) Field of Search .......................... 361/56; 333/215, 333/214; 330/265

(56) References Cited

U.S. PATENT DOCUMENTS

| | | | | |
|---|---|---|---|---|
| 3,778,734 A | * | 12/1973 | Colardelle et al. ........ 338/80 T |
| 4,823,092 A | * | 4/1989 | Pennock .................... 330/253 |
| 4,947,141 A | * | 8/1990 | Atkinson et al. .......... 331/135 |
| 5,263,192 A | * | 11/1993 | Mittel et al. ............... 455/313 |
| 5,585,741 A | * | 12/1996 | Jordan ........................ 326/30 |
| 5,696,403 A | * | 12/1997 | Rostoker et al. .......... 257/659 |
| 5,973,897 A | * | 10/1999 | Opris et al. ................ 361/56 |
| 6,028,496 A | * | 2/2000 | Ko et al. .................... 333/214 |
| 6,049,112 A | * | 4/2000 | Allen ......................... 257/355 |
| 6,104,230 A | * | 8/2000 | Jarcy ......................... 327/483 |
| 6,317,016 B1 | * | 11/2001 | Kuo ........................... 333/215 |
| 6,323,734 B1 | * | 11/2001 | Henrion et al. ............ 330/308 |
| 6,327,465 B1 | * | 12/2001 | Forbes ....................... 455/307 |

OTHER PUBLICATIONS

Johnson et al. Basic Electric Circuit Analysis, Prentice Hall, 1990, pp. 482–486.*

* cited by examiner

Primary Examiner—Gregory J. Toatley, Jr.
Assistant Examiner—Zeev Kitov
(74) Attorney, Agent, or Firm—Julie A. Stephenson; Kim Kanzaki

(57) ABSTRACT

An active inductance circuit for ESD parasitic cancellation is described. A feedback circuit on a transconductance amplifier is utilized to transform and reflect the impedance of an active inductor to minimize effects of parasitics produced by ESD circuitry. The active inductance circuit may be programmably implemented, allowing tunable component values.

43 Claims, 7 Drawing Sheets

(PRIOT ART)

ACTIVE INDUCTANCE FOR ESD PARASITIC CANCELLATION

FIELD OF THE INVENTION

The present invention relates to semiconductor devices, and more particularly to a system and method for compensating for parasitics caused by elements added to semiconductor devices for ESD protection.

BACKGROUND OF THE INVENTION

The technology of semiconductor design has advanced by decreasing circuit element dimensions and increasing circuit densities. The decrease in circuit element dimensions has resulted in the decrease of the thickness of insulating layers, such as gate oxide layers, with an associated decrease in the range of operating voltages. This scaling down of the insulating layers makes the semiconductor devices more sensitive to voltages outside of operating parameters (both overvoltages and undervoltages). An overvoltage or undervoltage can damage or destroy a semiconductor device by shorting through the thin insulating layers in the device.

A common type of damaging voltages outside of operating parameters is electrostatic discharge (ESD). A semiconductor device, such as a CMOS device, may be subjected to ESD merely by being handled by a person. The input and output terminals of a semiconductor device are easily touched, and thus are very susceptible to damage from ESD. To protect against damage from ESD, the input and output terminals of semiconductor devices typically include ESD protection circuitry. This ESD protection circuitry is designed to direct the charge (i.e. current) from an ESD event either to a power or a ground bus in the device. Although the operating voltages for a semiconductor circuit decrease with decreasing circuit element dimensions, the size of a typical ESD event remains the same. As a result, ESD protection circuitry is not typically scaled down with the rest of the circuit elements on a semiconductor device so that the same level of ESD protection can exist for the semiconductor device.

Unfortunately, ESD protection circuitry at an input or output (I/O) terminal of a semiconductor device adds parasitics (e.g. a parasitic capacitance) onto the signal lines of the I/O terminal. FIG. 1A is a block diagram of an I/O terminal 100 for a semiconductor device utilizing a conventional ESD protection circuit. I/O terminal 100 includes an I/O pad 110 coupled to ESD protection circuitry 120 at a node N1. The parasitic capacitance of ESD protection circuitry 120 is modeled as a capacitor 122. This parasitic capacitance (the impedance of ESD protection circuitry 120) forms a low pass filter (described in more detail below) with the effective signal source or load impedance. This low pass filter effect is unacceptable in high-speed circuit designs, such as gigabit Ethernet or Synchronous Optical Network (SONET) applications.

The impedance of a capacitor, represented as a Laplace transform, is $1/s*C$. The impedance of ESD protection circuitry 120 (e.g. $1/s*C122$) decreases as the frequency of the signal ($s=j\omega$) applied to I/O pad 110 increases. Because of voltage division between the signal source impedance and the impedance of ESD protection circuitry 120, the signal strength at I/O pad 110 decreases with the decrease in impedance of ESD protection circuitry 120. The magnitude and phase of the frequency response of the effect of ESD protection circuitry 120 on the signal at I/O pad 110 are shown in FIGS. 1B and 1C, respectively. As shown in FIG. 1B, ESD protection circuitry 120 causes attenuation of signals applied at I/O pad 110 having frequency greater than roll-off frequency F1. In this way, ESD protection circuitry 120 has the effect of a low pass filter. As the circuit element dimensions of the semiconductor device decrease (i.e. the internal semiconductor device circuitry (not shown) coupled to I/O pad 110), the negative effects of these parasitics attributable to ESD protection circuitry 120 become more pronounced.

It would be desirable to allow the ESD protection circuitry of a semiconductor device to remain large enough to handle typical ESD events while minimizing the effect of the parasitics caused by the ESD protection circuitry on a semiconductor device over a given range of operating frequencies.

SUMMARY

Accordingly, an active inductance system and method is described that allows effective cancellation of the negative effect of parasitics caused by ESD protection circuitry over a range of frequencies on a semiconductor device. An impedance from an active inductance circuit may be transformed and reflected back to an I/O terminal of the semiconductor device. This impedance is designed to match the parasitics (e.g. parasitic capacitance) of the ESD protection circuitry.

An active inductance circuit according to the present invention may also be used to match the impedance of the signal source or load on I/O terminals of the semiconductor device. In one embodiment of the present invention, the active inductance circuit is programmably implemented, providing the capability to tune the characteristics of the active inductance circuit.

The present invention will be more fully understood in view of the following description and drawings.

BRIEF DESCRIPTION OF THE DRAWINGS

Similar elements in figures are labeled similarly.

DETAILED DESCRIPTION

As described above, the negative effect of parasitics (e.g. parasitic capacitance) attributable to electro-static discharge (ESD) protection circuitry on the input or output (I/O) terminals of a semiconductor device take the form of a low pass filter, which is unacceptable for high speed applications. To compensate for the low pass filter effect of these parasitics, a novel active inductance circuit is described which may be used in conjunction with the ESD protection circuitry. The impedance of the active inductance circuit may be transformed and reflected back to the I/O terminal. This transformed and reflected impedance combines with the parasitics caused by the ESD protection circuitry to form a band pass filter, as described in detail below. In one embodiment, this impedance of the active inductance circuit is implemented programmably, making the active inductance circuit tunable.

Figure 2A:
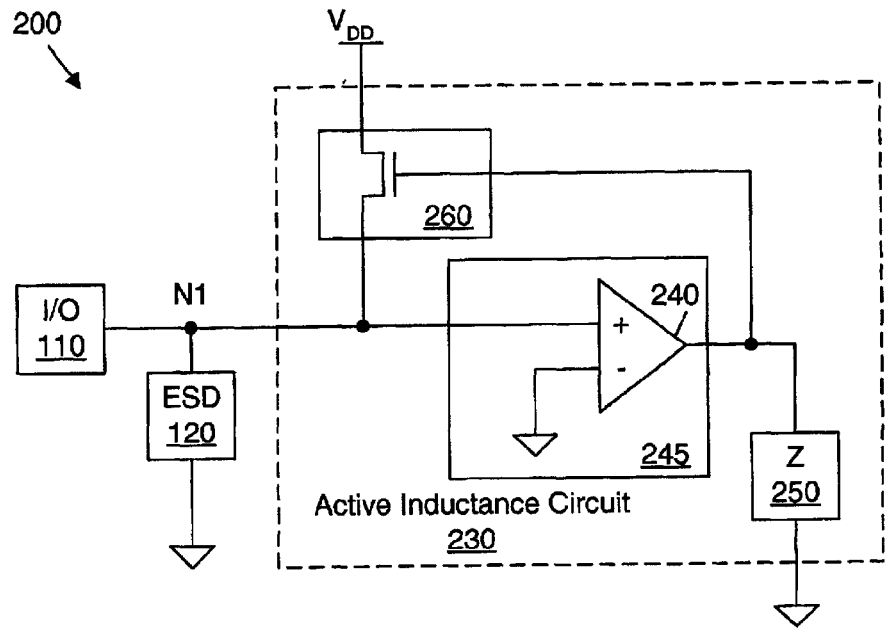
FIG. 2A is a block diagram of an I/O terminal in accordance with one embodiment of the present invention.

FIG. 2A is a block diagram of an I/O terminal 200 in accordance with one embodiment of the present invention. I/O terminal 200 includes an I/O pad 110, ESD protection circuitry 120, and an active inductance circuit 230. I/O pad 110 is an I/O terminal for a semiconductor device (not shown). For the purposes of discussion, the parasitics attributable to ESD protection circuitry 120 may be modeled as a capacitor. As described above, ESD protection circuitry 120 is designed to direct the charge (e.g. current) from an ESD event either to a power or a ground (as shown) bus in the semiconductor device. Thus, for illustration purposes of the effect of an active inductance circuit in conjunction with ESD protection circuitry 120 on an I/O pad, the signal source on I/O pad 110 may be modeled as a current generator.

Active inductance circuit 230 includes an amplifier circuit 245, an impedance circuit 250, and a feedback circuit 260. In this embodiment, amplifier circuit 245 comprises a transconductance amplifier 240. Other embodiments utilize other configurations of elements for amplifier circuit 245. The use of transconductance amplifier 240 in amplifier circuit 245 beneficially allows active inductance circuit 230 to be used on the output of a differential pair. A positive terminal of transconductance amplifier 240 is coupled to I/O pad 110 and ESD protection circuitry 120 at node N1. A negative terminal of transconductance amplifier 240 is coupled to a bus (e.g. a ground bus). A first terminal of feedback circuit 260 is coupled the output terminal of transconductance amplifier 240, a second terminal of feedback circuit 260 is coupled to a bus (e.g. a power bus $V_{DD}$), and a third terminal of feedback circuit 260 is coupled to the positive terminal of transconductance amplifier 240.

Feedback circuit 260 provides a feedback path from the output terminal of transconductance amplifier 240 to the positive terminal of transconductance amplifier 240. In one embodiment, feedback circuit 260 comprises a transistor having a gate coupled to the output terminal of transconductance amplifier 240 and a first source/drain region coupled to the positive terminal of transconductance amplifier 240. In one variation, this transistor is an n-type transistor. In another variation, this transistor is a p-type transistor. This feedback path is fast enough to compensate for the low pass effects of ESD protection circuitry 120.

A first terminal of impedance circuit 250 is also coupled to the output terminal of transconductance amplifier 240 and a second terminal of impedance circuit 250 is coupled to a bus (e.g. a ground bus) to provide a load for active inductance circuit 230. The characteristics of impedance circuit 250 may be designed to cancel the effect of parasitics caused by ESD protection circuitry 120 when transformed and applied to node N1 through feedback circuit 260 by forming an inductance in parallel with the capacitance of ESD protection circuitry 120. In this way, the characteristics of active inductor circuit 230 combine with the effect of parasitics of ESD circuitry 120 to alter the low pass filter effect on signals applied to I/O pad 110.

Figure 1A:
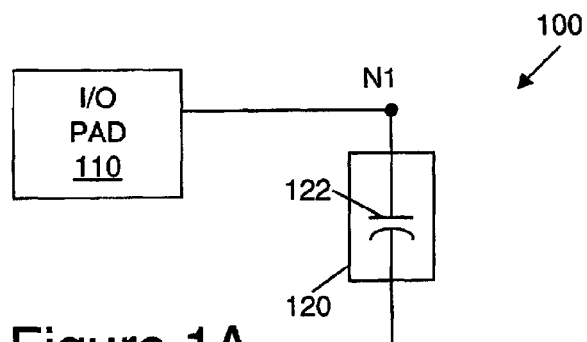
FIG. 1A is a block diagram of an I/O terminal for a semiconductor device utilizing a conventional ESD protection circuit.
Figure 1B:
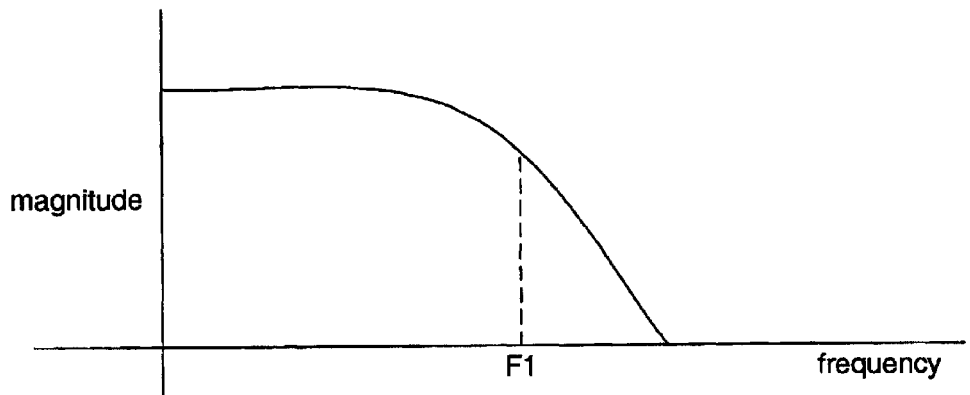
FIG. 1B is a plot of the magnitude of the frequency response of the signal at the I/O terminal of FIG. 1A.
Figure 1C:
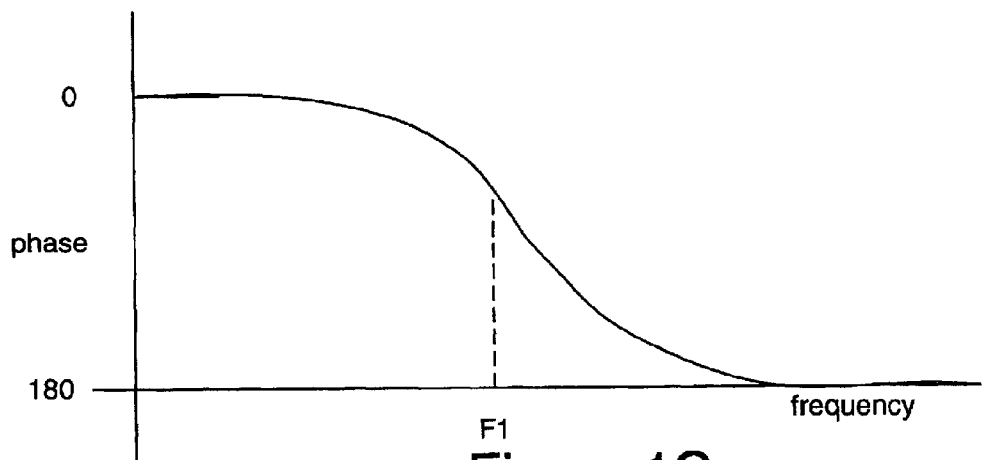
FIG. 1C is a plot of the phase of the frequency response of the signal at the I/O terminal of FIG. 1A.
Figure 2B:
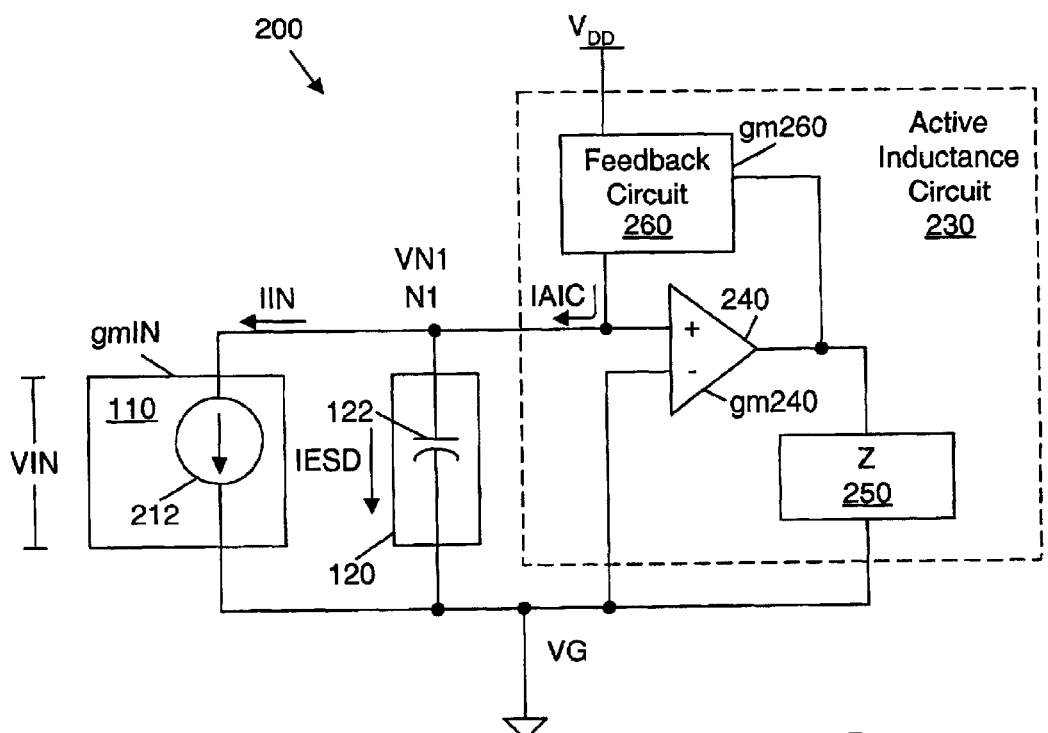
FIG. 2B is a block diagram of an I/O terminal redrawn for circuit analysis in accordance with one embodiment of the present invention.

FIG. 2B is a block diagram of I/O terminal 200 redrawn to more clearly illustrate the performance of the circuit in accordance with one embodiment of the present invention. A capacitor 122 is used to model the effect of parasitics of ESD protection circuitry 120 and a current generator 212 is used to model the current of a signal source from I/O pad 110. The use of capacitor 122 and the term parasitic capacitance with respect to the negative effects of ESD protection circuitry 120 are for clarity of illustration, and should not be construed as limiting the scope of application for active inductance circuit 230. The input current IIN produced by current generator 212 may be defined as:

$$IIN = VIN * gmIN \quad \text{Equation 1}$$

where VIN is the voltage of the signal source at I/O pad 110 (FIG. 1B) and gmIN is the transconductance factor at I/O pad 110. Conventionally, AC transconductance factors are represented by the lower case letters "gm".

The input current IIN produced by current generator 212 is also equal to the current through active inductance circuit 230 coming into node N1 less the current through ESD protection circuitry 120. The AIC current from active inductance circuit 230 into node N1 is equal to:

$$IAIC = (VN1 - VG) * gm240 * gm260 * Z \quad \text{Equation 2}$$

where VN1 is the voltage at node N1, VG is the ground bus potential (e.g. 0), gm240 is the transconductance factor of transconductance amplifier 240, gm260 is the transconductance of feedback circuit 260, and Z is the impedance of impedance circuit 250. The ESD current drawn by ESD protection circuitry 120 out of node N1 is equal to:

$$IESD = VN1 * s * C122 \quad \text{Equation 3}$$

where $(1/(s*C122))$ is the Laplace transform of the impedance of capacitor 122, and C122 is the capacitance of capacitor 122.

Using Equations 2 and 3 above, the input current IIN=IAIC−IESD may be written as:

$$IIN = VN1(s * C122 + gm240 * gm260 * Z) \quad \text{Equation 4}$$

Combining Equation 4 with Equation 1 yields:

$$VIN * gmIN = VN1(s * C122 + gm240 * gm260 * Z) \quad \text{Equation 5A}$$

The ratio of VN1 to VIN is the transfer function for I/O pad 110. Solving Equation 5A for HIN=VN1/VIN results in:

$$HIN = \frac{gmIN}{s * C122 + gm240 * gm260 * Z} \quad \text{Equation 5B}$$

Equation 5B represents the effect of the combination ESD protection circuitry 120 and active inductance circuit 230 on the signal from the signal source at node N1. In one embodiment, this effect may be altered by tuning the characteristics of impedance circuit 250 (e.g. by tuning Z) as described below.

The effect oft active inductance circuit 230 in conjunction with ESD protection circuitry 120 is described for two implementations of impedance circuit 250. In a first implementation, a lossless active inductor (using only a capacitor) is described. In a second implementation, a lossy active inductor (using a capacitor in series with a resistor) is described.

Implementation 1; Z=1/s*C

Figure 3A:
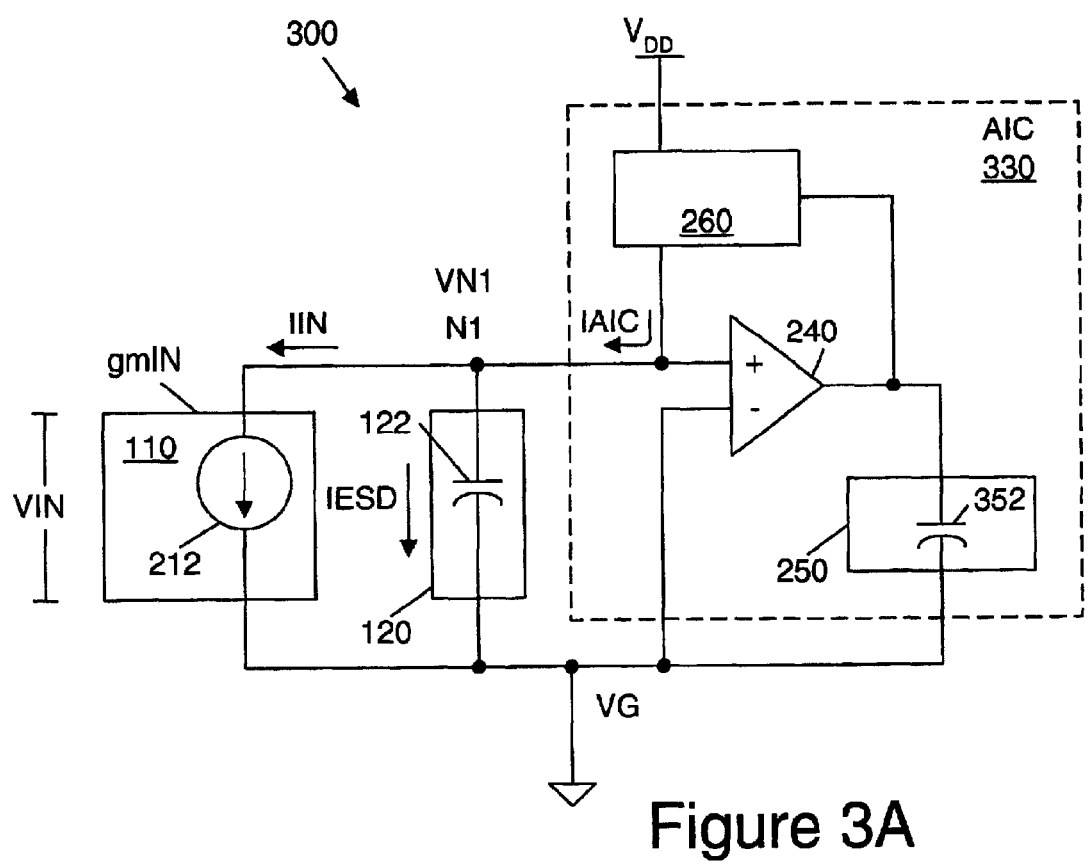
FIG. 3A is a block diagram of an I/O terminal using a lossless active inductor in accordance with one embodiment of the present invention.

FIG. 3A is a block diagram of an I/O terminal 300 using a lossless active inductor in accordance with one embodiment of the present invention. In this embodiment, impedance circuit 250 of active inductance circuit 230 includes a capacitor 352 coupled between the output terminal of transconductance amplifier 240 and a ground bus. The Laplace transform for the impedance of capacitor 352 is 1/s * C352, where C352 is the capacitance of capacitor 352. Thus, incorporating capacitor 352 into Equation 5B yields:

$$HIN = \frac{gmIN}{s*C122 + gm240*gm260*\frac{1}{s*C352}} \quad \text{Equation 6A}$$

which may be re-written as:

$$HIN = \frac{s*C352*gmIN}{s^2*C122*C352 + gm240*gm260} \quad \text{Equation 6B}$$

Figure 3B:
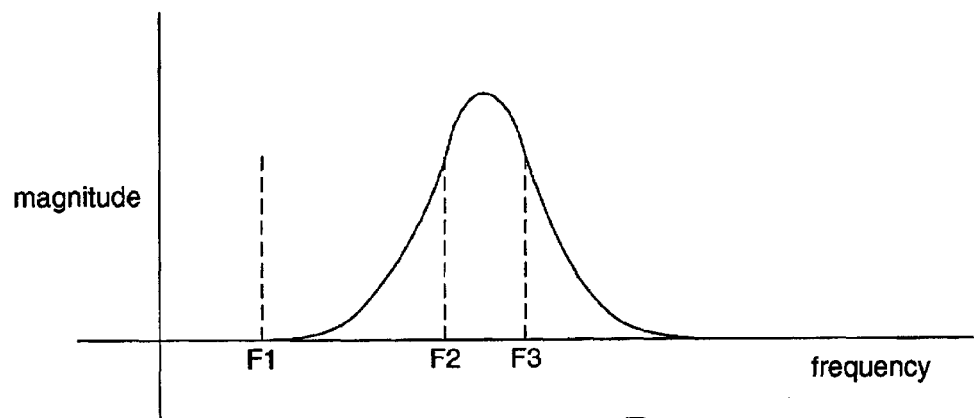
FIG. 3B is a plot of the magnitude of the frequency response of the signal at the I/O terminal of FIG. 3A.
Figure 3C:
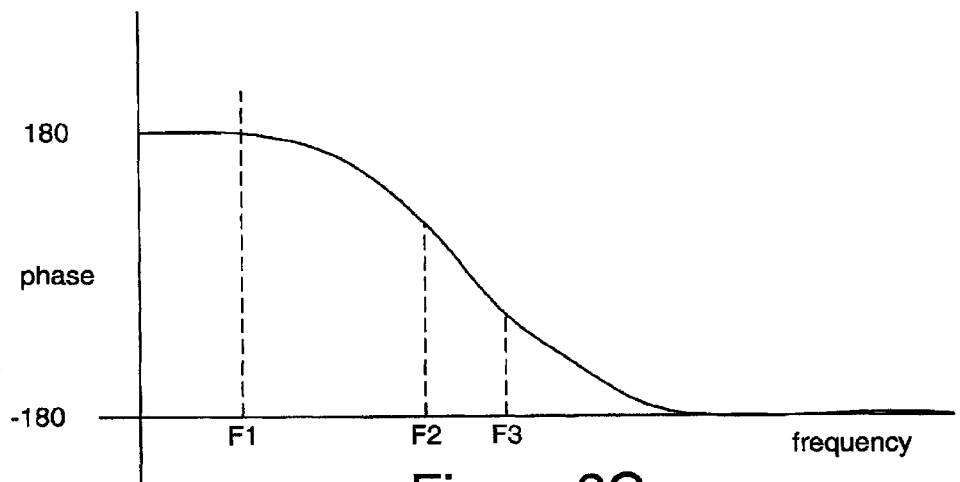
FIG. 3C is a plot of the phase of the frequency response of the signal at the I/O terminal of FIG. 3A.

FIGS. 3B and 3C are a magnitude plot and a phase plot, respectively, of the frequency response of I/O pad transfer function HIN (Equation 6B). As shown in FIG. 3B, the magnitude of the I/O pad transfer function frequency response shows that signals in the relatively narrow range of frequency F2 to frequency F3 (i.e. the pass band) to pass fill into the semiconductor device without attenuation by the parasitic effects of ESD protection circuitry 120. The roll-off frequency F1 from FIG. 1B has been labeled for illustration only to show the ability of the active inductance circuit 330 to affect the frequency pass band of signals applied to I/O pad 110 that are allowed into the semiconductor device. Other embodiments may have a similar frequency response with a frequency pass band lower than roll-off frequency F1 or co-located with roll-off frequency F1.

The Q, or Quality Factor, is a measure of the sharpness of the resonance peak of the frequency response. The shape of the peak of the magnitude plot shows the high Q of this embodiment. Q is equal to the resonant frequency divided by the bandwidth. Thus, a large Q indicates narrow bandwidth. This narrow band pass response of Equation 6B due to the lossless active inductor is useful for cancellation of narrow band parasitic effects of ESD protection circuitry 120.

It would be useful to achieve a wider bandwidth of cancellation for ESD protection circuitry parasitic effects, for example when using a clock recovery circuit application where the input signal spectrum has a large bandwidth that needs to be accommodated. This wider bandwidth cancellation is achieved using a lossy active inductor as described below.

Implementation 2; Z=R+1/s*C

Figure 4A:
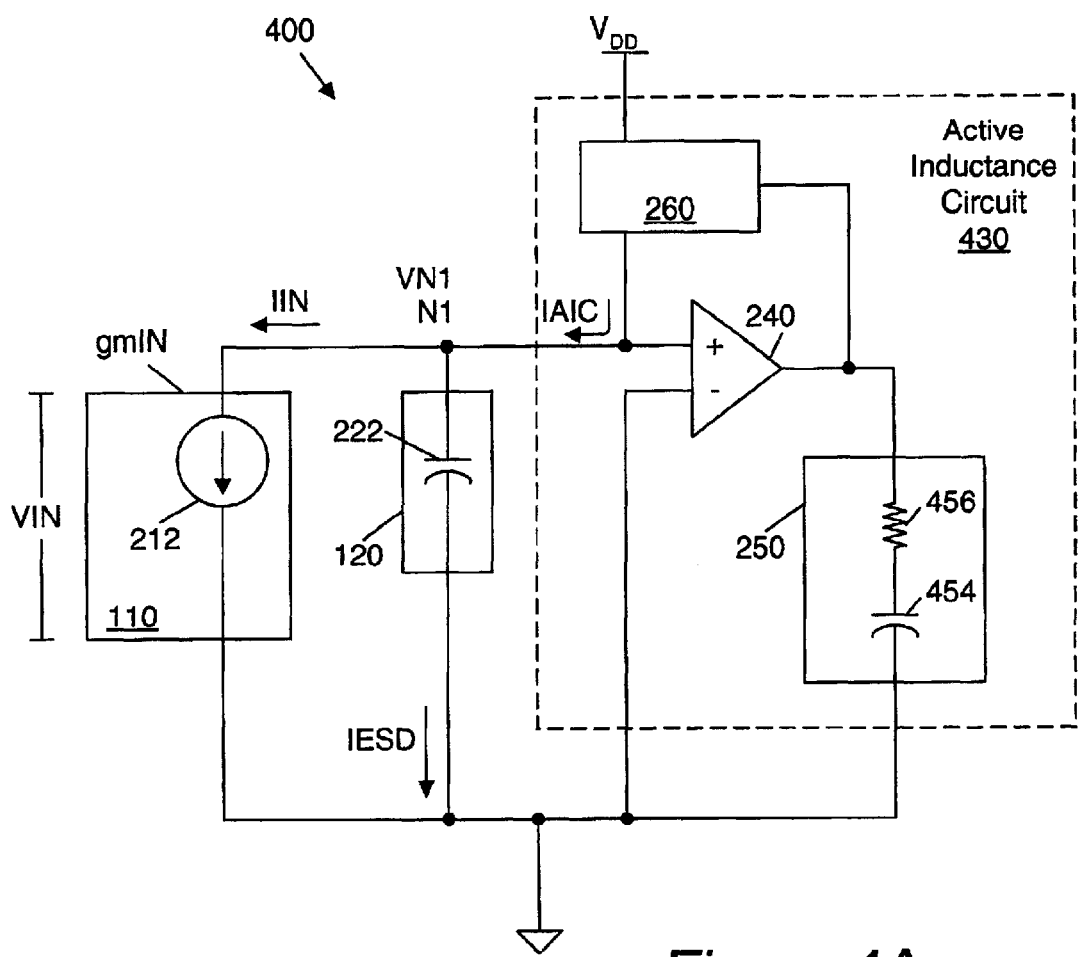
FIG. 4A is a block diagram of an I/O terminal using a lossy active inductor in accordance with one embodiment of the present invention.

FIG. 4A is a block diagram of an I/O terminal 400 using a lossy active inductor in accordance with one embodiment of the present invention. In this embodiment, impedance circuit 450 includes a resistor 456 coupled in series with a capacitor 454 between the output terminal of transconductance amplifier 240 and a ground bus. The Laplace transform for the impedance of resistor 456 in series with capacitor 454 is R456+1/s* C454, where R456 is the resistance of resistor 456 and C454 is the capacitance of capacitor 454. Thus, incorporating resistor 456 in series with capacitor 454 into Equation 5B yields:

$$HIN = \frac{gmIN}{s*C122 + gm240*gm260*\left(R456 + \frac{1}{s*C454}\right)} \quad \text{Equation 8A}$$

which may be re-written as:

$$HIN = \frac{s*C454*gmIN}{s^2*C122*C454 + s*gm240* gm260*R456*C454 + gm240*gm260} \quad \text{Equation 8B}$$

Figure 4B:
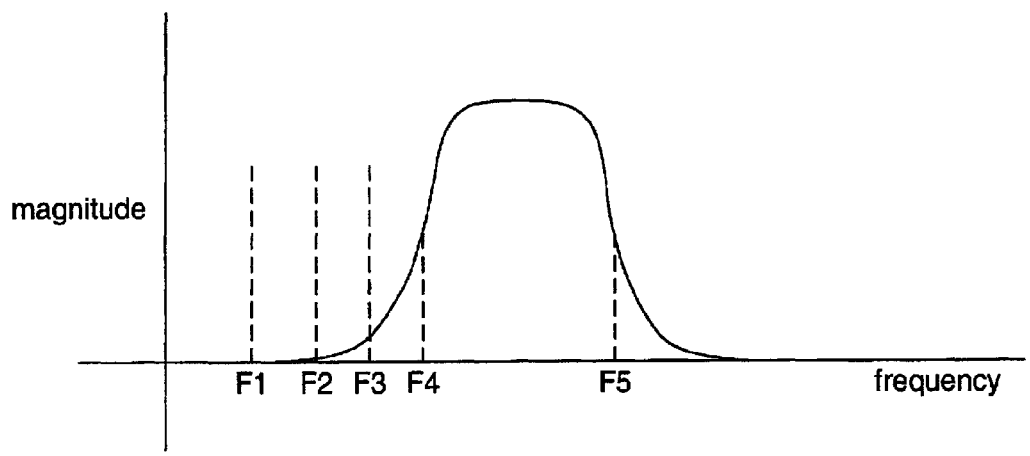
FIG. 4B is a plot of the magnitude of the frequency response of the signal at the I/O terminal of FIG. 4A.
Figure 4C:
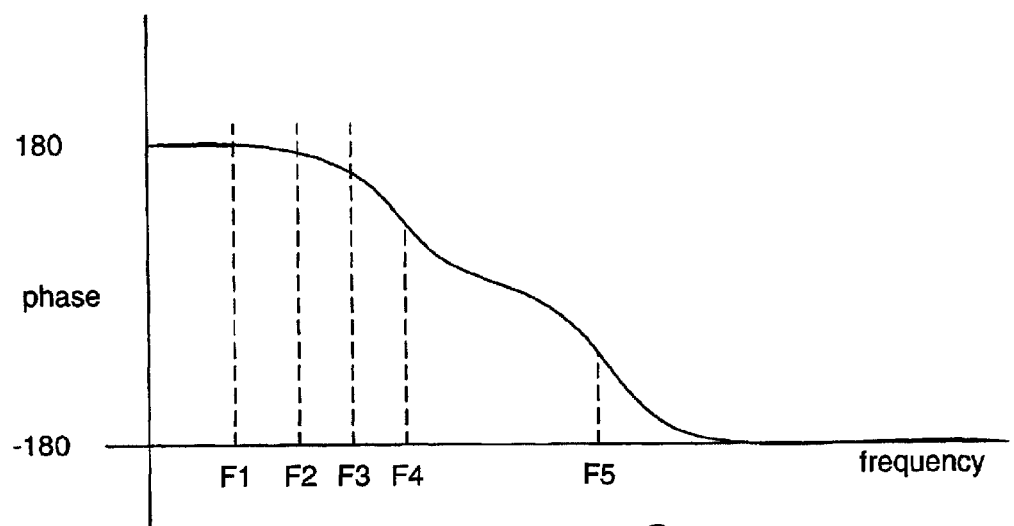
FIG. 4C is a plot of the phase of the frequency response of the signal at the I/O terminal of FIG. 4A.

FIGS. 4B and 4C are a magnitude and a phase plot, respectively, of the frequency response of I/O pad transfer function HIN (Equation 8B). As shown in FIG. 4B, the magnitude of the I/O pad transfer function frequency response allows signals in the relatively broad range of frequency F4 to frequency F5 (i.e. the pass band) to pass into the semiconductor device without attenuation by the parasitics of ESD protection circuitry 120. The roll-off frequency F1 (FIG. 1B) and the pass band frequencies F2 and F3 of FIG. 3B are labeled for illustration only to show the effect of the lossy inductor. Other embodiments may have a similar frequency response with a similar pass band located at another set of frequencies (e.g. with frequency F4 less than frequency F1 and frequency F5 greater than frequency F3). The widening and flattening at the top of the magnitude plot are a result of having the resistor R456 included in impedance circuit 250, and shows the low Q of this embodiment. This type of broadband (low Q) band pass effect is useful for high-speed circuit designs, such as gigabit Ethernet or Synchronous Optical Network (SONET) applications.

A lossless active inductor as shown in Equation 6B is useful for cancellation of narrow band parasitics of ESD protection circuitry 120, because the I/O pad transfer function has a narrow band pass filter response. Similarly, for high speed applications requiring a broader pass band, a lossy active inductor as shown in Equation 8B is more useful. The method of the present invention allows the ESD circuit to remain large enough to handle ESD events while minimizing the effect of the parasitics across a particular range (band) of frequencies.

In one embodiment, impedance circuit 250 is implemented programmably. As a result, the values of the components implementing impedance circuit 250 may be programmable, allowing impedance circuit 250 to be tuned. For example, implementing active inductance circuit 430 programmably allows the values of resistor 456 and capacitor 454 to be tunable. These programmable values for impedance circuit 250 allow the gain (e.g. the transconductance factor) and pass band of active inductance circuit 430 to change. Other embodiments have other configurations of impedance circuit 250, which may also be implemented programmably. Additionally, one skilled in the art may apply the teachings of the present invention to address impedance matching of the driving source and channel present on input terminals, or the channel and loads on output terminals.

The additional circuitry for an active inductance circuit in accordance with the present invention does require some power to operate. However, the power required by this active inductance circuit is much less than the reduction of overall power requirements of the semiconductor device caused by using the active inductance circuit. Thus, the overall power requirements of a semiconductor device utilizing an active inductance circuit in accordance with the present invention will have beneficially decreased. Additionally, extremes of process and temperature variation may cause an active inductance circuit in accordance with the present invention to reach instability during operation, which in the worst case may result in oscillation. However, well-chosen design parameters avoids this instability.

Figure 5:
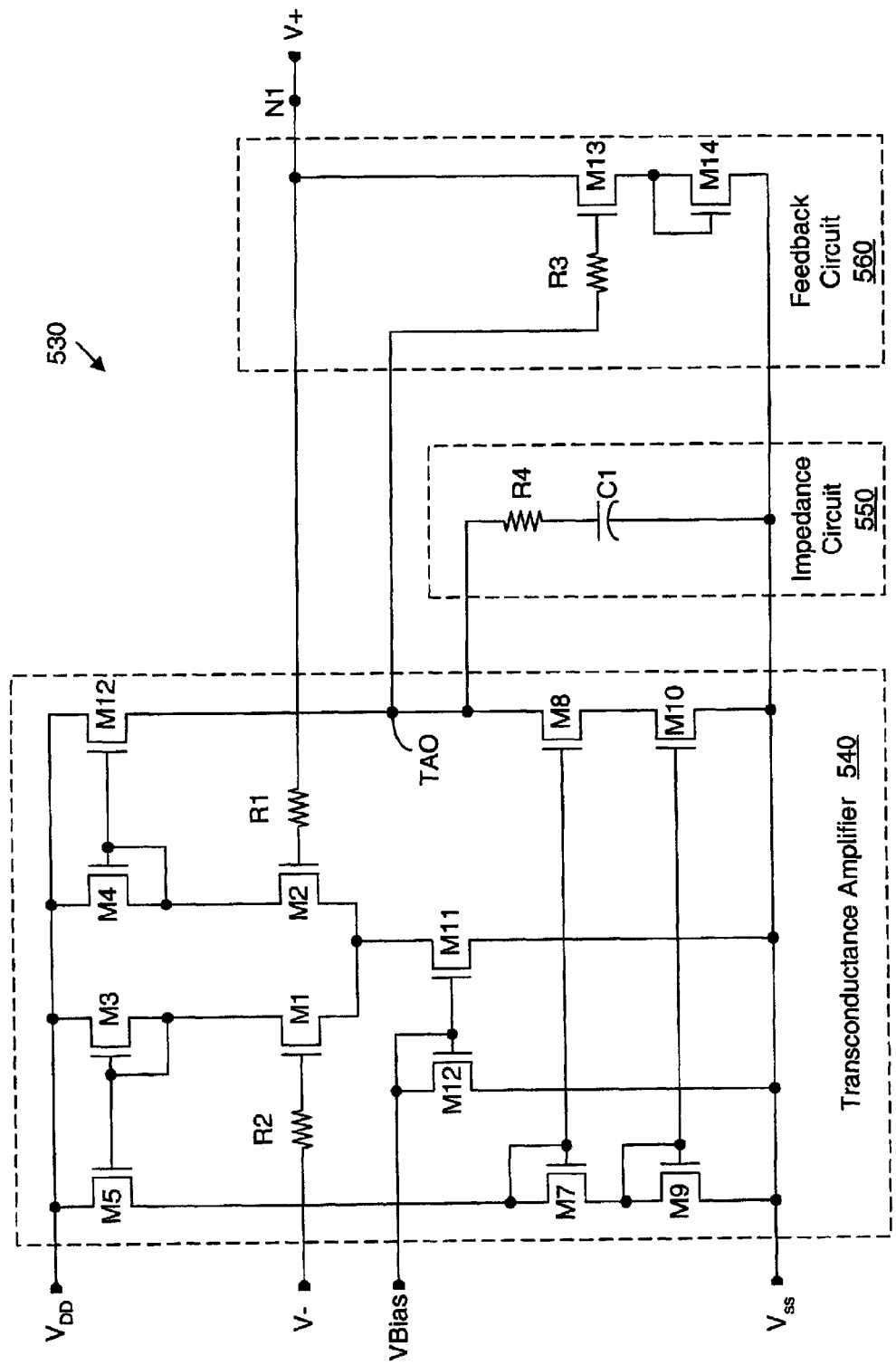
FIG. 5 is a circuit diagram of an active inductance circuit in accordance with one embodiment of the present invention.

FIG. 5 is a schematic diagram of an active inductance circuit 530 in accordance with one embodiment of the present invention. Active inductance circuit 530 includes transconductance amplifier 540, impedance circuit 550, and feedback circuit 560. Transconductance amplifier 540 includes transistors M1–M12 and resistors R1 and R2, which are configured to operate as a transconductance amplifier. Transconductance amplifier 540 has a positive terminal V+ coupled to node N1, and an output terminal TAO, as described above. Additionally, transconductance amplifier has a bias terminal VBias, and a connection to a power bus VDD and a ground bus.

Impedance circuit 550 includes a resistor R4 and a capacitor C1 coupled between the output terminal TAO of transconductance amplifier 540 and a ground bus VSS. Feedback circuit 560 includes a transistor M13, a transistor M14, and a resistor R3. Transistor M13 has a first source/drain region coupled to node N1 and a second source/drain region coupled to both a first source drain region and a gate of transistor M14. Resistor R3 is coupled between the output terminal TAO of transconductance amplifier 540 and a gate of transistor M13. A second source/drain region of transistor M14 is coupled to a ground bus VSS. Active inductance circuit 530 functions similarly to active inductance circuit 430.

In the various embodiments of this invention, novel structures and methods have been described to compensate for parasitics added by ESD protection circuitry. The various embodiments of the structures and methods of this invention that are described above are illustrative only of the principles of this invention and are not intended to limit the scope of the invention to the particular embodiments described. For example, in view of this disclosure, those skilled in the art can define other circuit elements that may be grouped together to function similarly to the embodiments described, such as other configurations of transistors, capacitors, resistors, and so forth, and use these alternative features to create a method or system according to the principles of this invention. Thus, the invention is limited only by the following claims.

What is claimed is:

1. An active inductance circuit coupled to electro-static discharge (ESD) protection circuitry in a semiconductor device, the active inductance circuit comprising:
    an amplifier circuit having a first input terminal coupled to the ESD protection circuitry;
    an impedance circuit coupled to an output terminal of the amplifier circuit; and
    a feedback circuit having a first terminal coupled to the output terminal of the amplifier circuit and a second terminal coupled to the first input terminal of the amplifier circuit.

2. The active inductance circuit of claim 1, the amplifier circuit comprising a transconductance amplifier coupled to the ESD protection circuitry.

3. The active inductance circuit of claim 1, the impedance circuit comprising a capacitor couple to the output terminal of the amplifier circuit.

4. The active inductance circuit of claim 1, the impedance circuit comprising:
    a resistor having a first terminal coupled to the output terminal of the amplifier circuit; and
    a capacitor having a first terminal coupled to a second terminal of the resistor.

5. The impedance circuit of claim 4, wherein the resistor is coupled in series between the output terminal of the amplifier circuit and the capacitor.

6. The active inductance circuit of claim 1, the feedback circuit comprising a first transistor.

7. The feedback circuit of claim 6, wherein the first transistor is an n-type transistor (NMOS).

8. The feedback circuit of claim 6, wherein the first transistor is a p-type transistor (PMOS).

9. The feedback circuit of claim 6, wherein a gate of the first transistor is coupled to the output terminal of the amplifier circuit and a first source/drain region is coupled to the first input terminal of the amplifier circuit.

10. The feedback circuit of claim 6, the feedback circuit further comprising a second transistor coupled in series with the first transistor.

11. The feedback circuit of claim 10, wherein a gate of the first transistor is coupled to the output terminal of the amplifier circuit and a first source/drain region is coupled to the first input terminal of the amplifier circuit.

12. The feedback circuit of claim 11, wherein a gate of the second transistor and a first source/drain region of the second transistor are coupled to a second source/drain region of the first transistor.

13. The feedback circuit of claim 11, further comprising a resistor coupled between the gate of the first transistor and the output terminal of the amplifier circuit.

14. The active inductance circuit of claim 1, wherein the active inductance circuit is tunably implemented.

15. The active inductance circuit of claim 14, wherein an impedance value of the impedance circuit is tunable.

16. An active inductance circuit coupled to electro-static discharge (ESD) protection circuitry in a semiconductor device, the active inductance circuit comprising:
    means for amplifying having a first input terminal coupled to the ESD protection circuitry;
    means for generating an impedance coupled to an output terminal of the means for amplifying; and
    means for providing feedback coupled between the output terminal of the means for amplifying and a first input terminal of the means for amplifying.

17. The active inductance circuit of claim 16, wherein the active inductance circuit is tunably implemented.

18. The active inductance circuit of claim 17, wherein the means for generating an impedance is programmable.

19. The active inductance circuit of claim 16, wherein the active inductance circuit changes a frequency response at an I/O terminal of the semiconductor device due to the ESD protection circuitry.

20. The active inductance circuit of claim 19, wherein the active inductance circuit coupled to the ESD protection circuitry produces a band pass filter at the I/O terminal of the semiconductor device.

21. An method of minimizing effects of parasitics caused by electro-static discharge (ESD) protection circuitry in a semiconductor device, the method comprising coupling an active inductor circuit in parallel with the ESD protection circuitry.

22. The method of claim 21, wherein the active inductor circuit coupled in parallel with the ESD protection circuitry allows receipt of a first range of frequencies by an input/output terminal (I/O) terminal of the semiconductor device.

23. An method of minimizing effects of parasitics caused by electro-static discharge (ESD) protection circuitry in a semiconductor device, the method comprising:

transforming an impedance; and reflecting the impedance back to the ESD circuitry, wherein the reflected, transformed impedance minimizes the effects of parasitics in a first range of frequencies.

24. The method of claim 23, wherein the first range of frequencies include high frequencies.

25. An active inductance circuit coupled to an input/output (I/O) terminal of a semiconductor device, the active inductance circuit comprising:

an amplifier circuit having a first input terminal coupled to the ESD protection circuitry;

an impedance circuit coupled to an output terminal of the amplifier circuit; and a feedback circuit having a first terminal coupled to the output terminal of the amplifier circuit and a second terminal coupled to the first input terminal of the amplifier circuit.

26. The active inductance circuit of claim 25, the amplifier circuit comprising a transconductance amplifier.

27. The active inductance circuit of claim 25, the impedance circuit comprising a capacitor.

28. The active inductance circuit of claim 25, the impedance circuit comprising:

a resistor; and a capacitor coupled to the resistor.

29. The impedance circuit of claim 28, wherein the resistor is coupled in series between the output terminal of the amplifier circuit and the capacitor.

30. The active inductance circuit of claim 25, the feedback circuit comprising a first transistor.

31. The feedback circuit of claim 30, wherein the first transistor is an n-type transistor (NMOS).

32. The feedback circuit of claim 30, wherein the first transistor is a p-type transistor (PMOS).

33. The feedback circuit of claim 30, wherein a gate of the first transistor is coupled to the output terminal of the amplifier circuit and a first source/drain region is coupled to the first input terminal of the amplifier circuit.

34. The feedback circuit of claim 30, the feedback circuit further comprising a second transistor coupled in series with the first transistor.

35. The feedback circuit of claim 34, wherein a gate of the first transistor is coupled to the output terminal of the amplifier circuit and a first source/drain region is coupled to the first input terminal of the amplifier circuit.

36. The feedback circuit of claim 35, wherein a gate of the second transistor and a first source/drain region of the second transistor are coupled to a second source/drain region of the first transistor.

37. The feedback circuit of claim 35, further comprising a resistor coupled between the gate of the first transistor and the output terminal of the amplifier circuit.

38. The active inductance circuit of claim 25, wherein an impedance value of the impedance circuit is tunable.

39. The active inductance circuit of claim 25, wherein the active inductance circuit matches an impedance of a source coupled to the I/O terminal.

40. The active inductance circuit of claim 25, wherein the active inductance circuit matches an impedance of a load coupled to the I/O terminal.

41. An active inductance circuit coupled to an input/output (I/O) terminal of a semiconductor device, the active inductance circuit comprising:

a means for amplifying coupled to the ESD protection circuitry;

a means for generating an impedance coupled to an output terminal of the means for amplifying; and a means for providing feedback circuit coupled between the output terminal of the means for amplifying and the ESD protection circuitry.

42. The active inductance circuit of claim 41, wherein the active inductance circuit matches an impedance of a source coupled to the I/O terminal.

43. The active inductance circuit of claim 41, wherein the active inductance circuit matches an impedance of a load coupled to the I/O terminal.

* * * * *